United States Patent [19]
Plesko

[11] Patent Number: 5,932,860
[45] Date of Patent: *Aug. 3, 1999

[54] LIGHT BEAM SCANNING PEN, SCAN MODULE FOR THE DEVICE AND METHOD OF UTILIZATION

[75] Inventor: George A. Plesko, Media, Pa.

[73] Assignee: GEO Labs, Inc., Media, Pa.

[ * ] Notice: This patent is subject to a terminal disclaimer.

[21] Appl. No.: 08/909,165

[22] Filed: Aug. 11, 1997

Related U.S. Application Data

[62] Division of application No. 08/620,973, Mar. 25, 1996, Pat. No. 5,656,805, which is a continuation of application No. 08/144,646, Oct. 28, 1993, Pat. No. 5,506,394, which is a continuation-in-part of application No. 08/006,754, Jan. 21, 1993, Pat. No. 5,469,291, which is a continuation-in-part of application No. 07/776,663, Oct. 15, 1991, Pat. No. 5,371,347, which is a continuation-in-part of application No. 07/612,983, Nov. 15, 1990, Pat. No. 5,187,612.

[51] Int. Cl.$^6$ ........................................... G06K 7/10
[52] U.S. Cl. ............... 235/454; 235/462.32; 235/462.37; 235/472.01; 250/353; 359/224
[58] Field of Search ................................ 235/454, 462.32, 235/462.33, 462.35, 462.37, 462.38, 462.46, 462.49, 472.01, 472.02, 472.03; 250/353, 275; 359/224, 199, 213, 872

[56] References Cited

U.S. PATENT DOCUMENTS

| | | | |
|---|---|---|---|
| 3,650,581 | 3/1972 | Boden et al. | 310/50.5 |
| 4,042,821 | 8/1977 | Mierzwinski | 250/216 |
| 4,131,485 | 12/1978 | Meinel et al. | 359/853 X |
| 4,364,000 | 12/1982 | Burke, Jr. | 350/6.5 X |
| 4,433,273 | 2/1984 | Petersen | 310/20 |
| 4,471,218 | 9/1984 | Culp | 235/462.45 |
| 4,496,831 | 1/1985 | Swartz et al. | 235/472.01 |
| 4,575,625 | 3/1986 | Knowles | 235/472.01 X |
| 4,639,589 | 1/1987 | Weber et al. | 250/203 |
| 4,697,084 | 9/1987 | Fox | 359/859 X |
| 4,794,239 | 12/1988 | Allais | 235/462.45 |
| 4,871,904 | 10/1989 | Metlitsky et al. | 235/472 X |
| 4,878,721 | 11/1989 | Paulsen | 350/6.6 |
| 4,907,864 | 3/1990 | Hagerty et al. | 350/413 |
| 4,935,609 | 6/1990 | Wike, Jr. | 235/472.03 |
| 4,958,064 | 9/1990 | Kirkpatrick | 235/470 X |

(List continued on next page.)

OTHER PUBLICATIONS

Winston, R., "Nonimaging Optics", Scientific American, Mar. 1991, pp. 76–81.

Welford et al., High Collection Nonimaging Optics (1989) pp. 1–6, 42–45, 48–65, 72–79, 94–102, 126–129, 170, 173, 182–185, 192–195, 214–215, Month missing.

"Laser versus CCD: Which bar code scanners are best for your company?", Automatic I.D. News, Dec. 1995, pp. 29–30.

*Primary Examiner*—Michael G. Lee
*Attorney, Agent, or Firm*—Reed Smith Shaw & McClay

[57] ABSTRACT

A high speed non-contact beam scanning device sized and shaped to provide the ergonomic benefits of a pen or wand, yet can scan a wide angle moving beam across an information-bearing target in one or two dimensional scan patterns such as lines, rasters or other patterns in order to read information therefrom. The device is well suited for reading one or two dimensional bar-code or other printed matter. In order to achieve the high density optical packaging necessary for its high performance to size benefits the device employs a novel in-line or "axial" gyrating, or "axial" scan element. The axial scan element can accept an input light beam at one end and cause the light beam to emerge from its opposite end as a scanned beam, propagating in the same general forward direction the light beam had upon entering the element. Reflected light, which carries information contained on the target, is collected by an internal non-imaging light collector and is processed by signal processing electronics. All components are integrated into a thin low mass module small enough to fit in a pen. The device is achievable by a cable or by wireless communication.

23 Claims, 11 Drawing Sheets

U.S. PATENT DOCUMENTS

| | | | |
|---|---|---|---|
| 4,962,311 | 10/1990 | Poisel et al. | 250/216 |
| 4,967,076 | 10/1990 | Schuhmacher et al. | 250/236 |
| 4,971,410 | 11/1990 | Wike, Jr. et al. | 235/472.03 X |
| 4,989,948 | 2/1991 | Dreyer, Jr. | 359/850 X |
| 4,999,491 | 3/1991 | Semler et al. | 250/236 |
| 5,023,440 | 6/1991 | Kuppenheimer, Jr. | 250/230.6 |
| 5,047,617 | 9/1991 | Shepard et al. | 235/472 X |
| 5,059,779 | 10/1991 | Krichever et al. | 235/472.01 X |
| 5,062,095 | 10/1991 | Horikawa et al. | 359/822 X |
| 5,065,003 | 11/1991 | Wakatuski et al. | 235/462.45 |
| 5,130,520 | 7/1992 | Shepard et al. | 235/462.45 |
| 5,140,141 | 8/1992 | Inagaki et al. | 235/462.45 |
| 5,144,120 | 9/1992 | Krichever et al. | 235/472.01 |
| 5,149,949 | 9/1992 | Wike, Jr. | 235/462.45 X |
| 5,168,149 | 12/1992 | Dvorkis et al. | 235/472.01 |
| 5,170,277 | 12/1992 | Bard et al. | 359/210 |
| 5,187,612 | 2/1993 | Plesko | 359/896 |
| 5,235,167 | 8/1993 | Dvorkis et al. | 235/462.45 |
| 5,254,858 | 10/1993 | Wolfman et al. | 250/339 |
| 5,268,564 | 12/1993 | Metlitsky et al. | 235/472.01 X |
| 5,367,151 | 11/1994 | Dvorkis et al. | 235/472.01 |
| 5,369,262 | 11/1994 | Dvorkis et al. | 235/472.01 |
| 5,371,347 | 12/1994 | Plesko | 235/454 X |
| 5,469,291 | 11/1995 | Plesko | 359/224 |
| 5,506,394 | 4/1996 | Plesko | 235/472.03 |

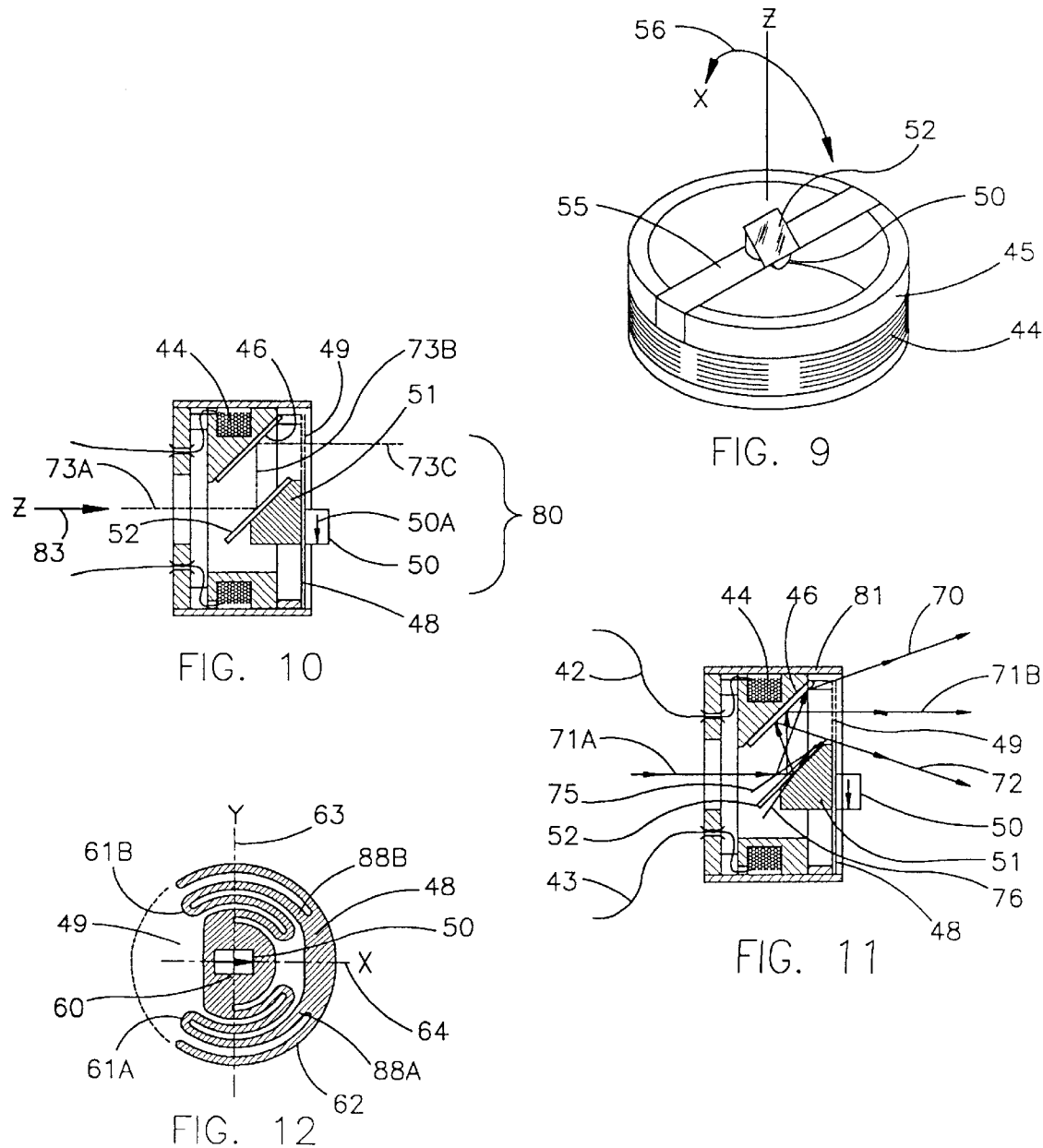

LIGHT BEAM SCANNING PEN, SCAN MODULE FOR THE DEVICE AND METHOD OF UTILIZATION

This is a divisional of Ser. No. 08/620,973, filed Mar. 25, 1996, now U.S. Pat. No. 5,656,805, which is a continuation of Ser. No. 08/144,646 filed Oct. 28, 1993, now U.S. Pat. No. 5,506,394, which is a continuation-in-part of U.S. patent application Ser. No. 07/776,663 entitled "Electro-Optical Scanning System With Gyrating Scan Head", filed Oct. 15, 1991, now U.S. Pat. No. 5,371,347 and of Ser. No. 08/006,754 filed Jan. 21, 1993, now U.S. Pat. No. 5,469,291 which is a continuation-in-part of Ser. No. 07/612,983, filed Nov. 15, 1990, now U.S. Pat. No. 5,187,612, issued Feb. 16, 1993 entitled "Gyrating Programmable Scanner".

BACKGROUND OF THE INVENTION

FIELD OF THE INVENTION

The field of beam scanning for the purpose of gathering information is rapidly advancing. The commercial application and importance of bar-code reading is well known and is now becoming more sophisticated with the introduction of high density two dimensional bar-code. Code 49, Code 1, and PDF 417 are examples of new bar-code standards that contain information in a two dimensional array.

As information densities increase, scanning with high speed scan patterns becomes necessary in order to read them rapidly. In addition to bar-code reading, the ability to read alphanumeric information is also of great commercial value. Other types of encoded information are being devised, and object recognition requiring scanning readout equipment is also of commercial importance.

As sophisticated portable requirements expand the demand for ever smaller high performance hardware increases.

The present invention provides a portable non-contact moving beam scanning device small enough to be comfortably held with the thumb and fingers like a pen, yet able to automatically scan a moving beam across a distant target containing information such as printed bar-code. The invention contains a novel in-line, or "axial," gyrating scan element, which can accept an input light beam at one end and cause it to emerge as a scanned beam at its opposite end, propagating about a neutral axis in the same general forward direction as it had upon entering the element. With this axial scan element, it is possible to construct an in-line arrangement of a light source and the scan device, thereby greatly simplifying and reducing space requirements for the optical layout of a scanner.

The scanning speeds may range from tens of scans per second to thousands of scans per second, at angles of forty degrees or more, and scanning in two dimensions is also possible. In its preferred embodiments, the invention is distinguished from prior art devices in that the beam passes through an oscillating scan element and generally maintains its original direction upon emergence from the element, rather than consuming the additional space needed to ultimately reverse beam direction.

Configured as a pen-sized and pen-shaped device, the invention also may contain an integrated light source (such as a diode laser), a beam focusing means, and a novel non-imaging light collector coupled to an information processing means for extracting information from the reflected light, as well as an inertially activated switch for turning the device on and off to provide a complete scanning system.

The entire system can be designed to fit into a miniature housing, which may be sized and shaped like a pen or wand, making possible the development of a new generation of compact laser scanning implements not previously available. In doing so the present invention overcomes many of the limitations of prior art devices such as contact-wands which must contact the bar code to be read and pistol grip bar code readers which are presently far larger than is desirable.

In particular, the invention relates to an integrated beam scanning module for use within the device, which can be easily fabricated in the form of a cylindrical module having dimensions of about three eighths of an inch in diameter by three quarters of an inch in length. The scan module's rugged housing may be made from a heat dissipating material (such as anodized aluminum) for conducting heat away from a laser diode.

The present invention also provides in a pen or wand size scanning system, the capability of generating two-dimensional scan patterns such as rasters or omni-directional patterns for reading printed indicia with little regard for orientation of printed material. It also enables one or two dimensional high density bar-code targets to be read at significant distances. This is done by means of high speed wide angle rastering scan patterns.

The present invention further includes methods for using a low mass pen-sized laser beam scanner mounted in ways that are impossible or cumbersome using current state of the art devices. For example, the device can be housed in a pen-sized tube allowing new mounting possibilities such as attachment to a light weight cap or safety helmet, to the temple of eyeglass frames, badges or a robot arm. Mounting several similar devices in a bundle can achieve overlapping scan patterns or redundancy in small spaces.

The invention also relates to methods for using the pen-size scanning system to inexpensively generate raster patterns. This is done by bending one's wrist while holding a device which produces a one-dimensional line scan, thereby deflecting the scanned beam to effect both X and Y-axis scanning, a process which may be termed "wrist rastering".

In addition, the invention also relates to methods for using the pen-size scanning system by visually impaired individuals to avoid obstacles and to read books printed in two dimensional bar-code or conventional print. It also relates to methods of using the scan system by individuals with various other physical disabilities, who are not adequately accommodated by the design and physical operating requirements of existing "pistol-grip" scanners.

DESCRIPTION OF THE PRIOR ART

The utilization of portable scanning devices for reading bar-codes is experiencing tremendous commercial success. Among the most popular portable bar-code scanners available today are those which fall into the contact wand category and those in the non-contact, pistol shaped category.

The contact ward type bar-code reader device commonly used today is packaged so as to resemble a thick pen, about one half inch in diameter. It is light, rugged and easy to hold, but its use is confined to reading smooth flat surfaces with relatively high quality printed bar-code. These devices typically contain a light emitting diode light source and an electronic photo detector. A small spherical sapphire tip with an extremely short focal length focuses the light at the tip of the wand. Because of this short focal length the device has virtually no depth of field and a major drawback of being essentially limited to contact reading.

The contact wand is used by bringing it into contact with the surface upon which the bar-code is printed and then dragging the tip across it, yielding only one scan per swipe of the user's hand. Because the wand tip devices must first be oriented so that the anticipated motion of the hand will be able to pass through all bars of the code, a significant degree of skill to drag it across the bar-code at a uniform and suitable rate of speed is required for successful operation. Surface damage often results in many repeated reading attempts as well as poor productivity.

Contact-type scan wands are also poorly suited to scanning printed material that has damage (as coupons usually do when carried around in a purse), or when the surface that is labeled or printed upon is curved, soft, irregular or wrinkled such as mailing pouches, or with other generally non-flat surfaces upon which bar-code is printed.

In order to overcome some of the problems associated with contact wand readers, portable laser reading guns were developed. These typically read bar-code at distances ranging from inches to several feet. Consequently, these are more effective for reading bar-codes printed on irregular surfaces, but have the drawback of being far bulkier than contact wands.

One such gun-type device, described in U.S. Pat. No. 4,387,297, is a non-contact portable gun-shaped laser scanner with a pistol grip and a trigger with which to activate the scan sequence. The gun-type scanners have ergonomic characteristics similar to those of a hand gun, yet are generally bulkier; in many cases, they are more like a hand-held hair dryer and are not amenable to being carried in a pocket or to storage in a cash drawer.

A gun reader includes a light source which produces a laser light beam that is directed away from a target. The beam is internally reversed by means of a series of mirrors either fixed or mounted on one or more moving motor shafts causing it to scan, whereupon the beam finally emerges in the direction of the selected target. This arrangement requires ample layout space so the outgoing beam is not occluded by the laser light source and light collection apparatus.

To use this gun-type scanner, it is aimed by sighting the target to be read and then the trigger is squeezed with the user's index finger, whereupon a scanned laser beam emerges, which, if suitably aimed and oriented, will sweep across a bar-coded label and read the information encoded thereon.

The aim and shoot characteristics of the gun-type device are suited for long range bar-code reading on the order of a few feet, but remain clumsy for short range reading jobs where distances of about six inches to one foot are involved, especially when the user is seated at a desk or counter. In such cases, the ergonomic benefits are lost and become liabilities.

Because of its size and handling requirements, numerous problems associated with the pistol-grip aim and shoot design result.

Aim and shoot applications require a significant amount of hand-eye coordination to a) hold, b) aim, c) trigger and d) orient the scanner so the scan line will pass through all bars of the code. With these functional demands placed on the user, difficulty of operation increases significantly with any physiological impairments or severance of digits the operator may have. Placement of the trigger, for instance, assumes that the user has a functional index finger. If fingers further down the hand are the only ones capable of the necessary squeezing movement, the user has no choice but to try to operate the gun by holding it in a way other than the design accommodates. Of course, users with substantial disability impairing their ability to grip at all, are entirely precluded from using aim and shoot type pistol grip devices. Because of its weight, dimensions and triggering mechanics, other methods of holding and moving the device without using the hand and fingers to grip and manipulate are ungainly.

Pistol grip aim and shoot scanners create special problems for users with disabilities, and reasonable accommodation problems for employers under the new *Americans with Disabilities Act*. Another problem is realized when observing the extent to which an able-bodied user's gripping hand is monopolized by the holding and operation of the gun. For example, a clerk using the device at a checkout counter, in conjunction with a cash register key pad for unlabled items typically uses one hand to pick up and orient items advancing on a conveyor belt so that the label can be read. The other hand is used to operate the scanner gun. It has been observed that whenever the clerk needs to use the keypad, s/he must first lay down the gun to free up the hand, use the keypad, then pick up the gun once more. This can cut into productivity significantly and impede the flow of work.

Another problem associated with aim and shoot devices is that they typically require operators working at counters to pull their using arm back at the elbow so that the end of the gun clears the surface of the label they are attempting to scan. In toy stores, for example, some items or boxes are so bulky that operators of average height must remove the item from the counter, hold it off to the side with one hand, at a lower level than the counter so that the end of the gun can clear the target scanning surface, while attempting to scan with the other hand.

Apart from being unsound from a general human factors viewpoint, this extra movement can create discomfort for people with arthritis, bursitis, and other diseases, injuries or disabilities affecting the articulations of the shoulder. The problem is worsened if the operator needs to be seated at a counter.

In the instance of a person with a disability who must be seated at a work counter designed for a standing able-bodied person, the *Americans with Disabilities Act* may require that the work area be redesigned as a "reasonable accommodation" if a friendlier scanner design were not available.

The very shape of gun-type scanners can pose safety concerns in some instances, such as an employee working on a late shift in a warehouse carrying and using the gun, wherein contract security personnel might become unduly alarmed by the pistol-like appearance, especially when observed at a distance.

Another type of scanning gun is described in U.S. Pat. No. 4,652,750. In the case of this device, the scanning beam is not automatically placed in motion and the user must not only aim the device from a distance at the target label, but must then continue to manually direct the beam from one side of the label to the other without falling outside the boundaries of the label and maintaining a uniform speed in doing so. This is extremely difficult, since bar-code labels are typically about the size of a large postage stamp. Also, relatively minor curves in the scan line caused by the amplification of normal hand movement as a function of target distance may throw off the time values assigned to each element of the bar code and result in a bad scan. Repeated attempts are more and more likely to be poor as well, as the result of natural hand-arm fatigue and frustration. This device was therefore not very successful commercially.

Another prior art invention describes a moving beam bar-code scanner that is affixed on the back of the operator's hand. The fingers are freed from the arresting level of involvement required to operate a pistol-grip mechanism, yet the design is nonetheless ungainly because the back of the hand is not well-suited to aiming the beam.

Another category of readers for bar-code and printed matter are the so called CCD or "Charge Coupled Devices" types, which use an imaging technique similar to that in facsimile machines. CCDs do not contain lasers or other light beam sources and are much different from the beam scanning readers. CCD readers contain photo diode arrays upon which the bar-code must be imaged. Computer programs then decipher the imaged information pattern thus formed. Generally, CCD readers must be placed on top of and cover the target bar-code, have poor depth of field and are limited as to the size of bar-codes to be read, and thus possess many of the limitations of contact readers. Experimental CCD systems with expensive large lens focusing systems can achieve modest improvements in the depth of field, but are bulkier and expensive.

Some laser scanners utilize polygonal mirrors rotated by motors to generate scan lines by reflecting a laser beam off the mirrors as they pass in front of the beam. Owing to a complex optical path with ample head room requirements for the beam to escape, these scanners are bulky and at best may be packaged in boxes or gun shaped housings, but not smaller.

U.S. Pat. No. 4,871,904 describes a two-dimensional scanning system in which a laser source light beam is directed at a scanning element having a pair of mirrors which reflect and redirect the beam so that it emerges as a scanning beam travelling in the same general direction as the source beam. The mirrors are each mounted at an angle on a motor shaft, and motor rotation provides a scanning beam. Because of the size of the motors required, this system is ill suited to hand-held scanners. It has a limited range of scan patterns, all of which include a significantly curved path of the moving beam; it cannot produce a line or raster scan. Also, because of motor inertia, this system is ill suited to the intermittent operation characteristic of a hand-held scanner.

Existing fixed mount scanners are not amenable to mounting on robot arms for use on production lines because of their size and weight.

Reluctance of employees to accept new bar-code scanning applications because of the clumsiness or inconvenience of the equipment is also an important issue. For example, nurses, in the course of their patient care duties, have been resistant to the idea of using bulky bar code readers because of the clumsiness and inconvenience of the devices. Other problems with prior art devices stem from the inability to mount them in tiny housings because of the space consuming clearance requirements associated with non-axial optical designs.

U.S. Pat. No. 5,198,651 describes a somewhat compact scanning device having a unitary framework structure with numerous ribbed elements to hold its components closely together and to shock mount them. Even so this scan engine is too bulky to fit into a pen-size housing and cannot produce two dimensional scan patterns. It suffers from the common optical layout problem of having to provide ample head room for the emerging scan beam.

None of the known moving beam or CCD scanning systems which can automatically scan one or two dimensions in order to read information is small enough to be packaged into a housing having the general size and shape of a pen or wand.

SUMMARY OF THE INVENTION

Objects of the Invention

It is a general object of this invention to provide a moving light beam non-contact bar-code scanner with light collector and circuitry entirely housed a pen or wand shaped housing, which can be comfortably gripped by the fingers with the ergonomic benefits of a pen or wand.

It is another object of this invention to provide a small integrated in-line or "axial" scan module on the order of three eighths of an inch in diameter, all contained within a heat dissipating shell, which can fit into the front of a non-contact light scanning "pen".

Yet another object of this invention is to provide a scanning method utilizing a non-contact, wide-angle beam scanner "pen" in which a beam is caused to scan its target several hundred times per second, thereby allowing the user to raster the scan across a two-dimensional bar-code with relatively slight movement of the body part employed to hold the device.

Still another object of the invention is to provide a pen-sized, beam scanning, information collection device that includes a coaxial light collector which presents collected and concentrated light to a small area photoelectric converter, such as a photo diode with associated amplification, signal and information processing circuits.

Still another object of the invention is to provide in a beam scanning "pen" a two dimensional scanning capability useful for a dynamic laser pointer or bar-code scanner.

A further object of the invention is to provide compact scan modules and elements packageable into equipment as small as a pen for use in miniature scanning applications.

Features of the Invention

The invention itself, however, both as to its construction and its method of operation, together with additional objects and advantages will be best understood from the following description of specific embodiments hen read in connection with the accompanying drawings, and from the claims.

BRIEF DESCRIPTION OF THE DRAWINGS

FIG. 9 illustrates a suspension mechanism for a low speed axial scan element.

FIG. 10 is a cross sectional view of an axial scan element and internal parts.

FIG. 11 illustrates the axial scan element of FIG. 10 with a beam entering at one end and emerging at various angles from the opposite end.

FIG. 12 illustrates a preferred suspension for use in an axial scan element.

DETAILED DESCRIPTION OF THE PREFERRED EMBODIMENTS AXIAL SCAN ELEMENT

As has been described, prior art hand-held non-contact laser scanners such as the gun-type scanners have been bulky, heavy, and accordingly less than optimal in their ergonomic characteristics. Because of their size and shape, they have been designed and are suitable for use by gripping in the palm of the user's hand. Non-scanning bar-code readers such as the contact wand type have superior ergonomics but are limited in their applicability because of their requirements for contact with the bar-code and physical sweeping movement by the user.

Figure 1:
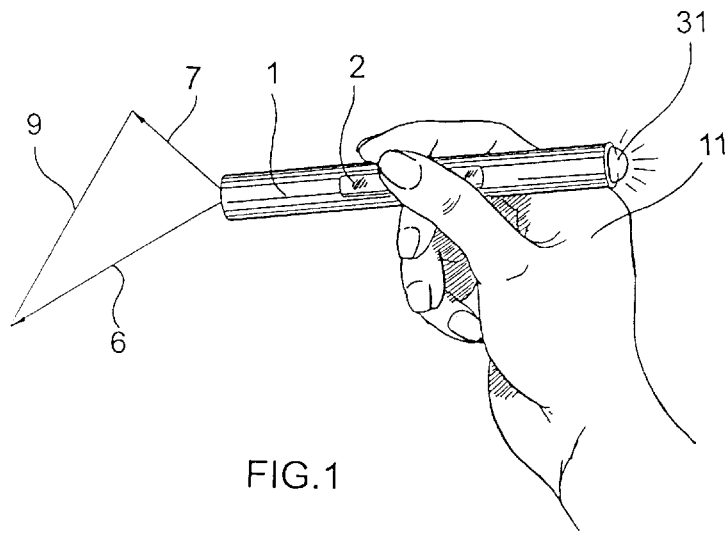
FIG. 1 illustrates a method of use of the scanner according to the invention, whereby the device can be gripped with the ergonomic benefits of a pen.
Figure 2:
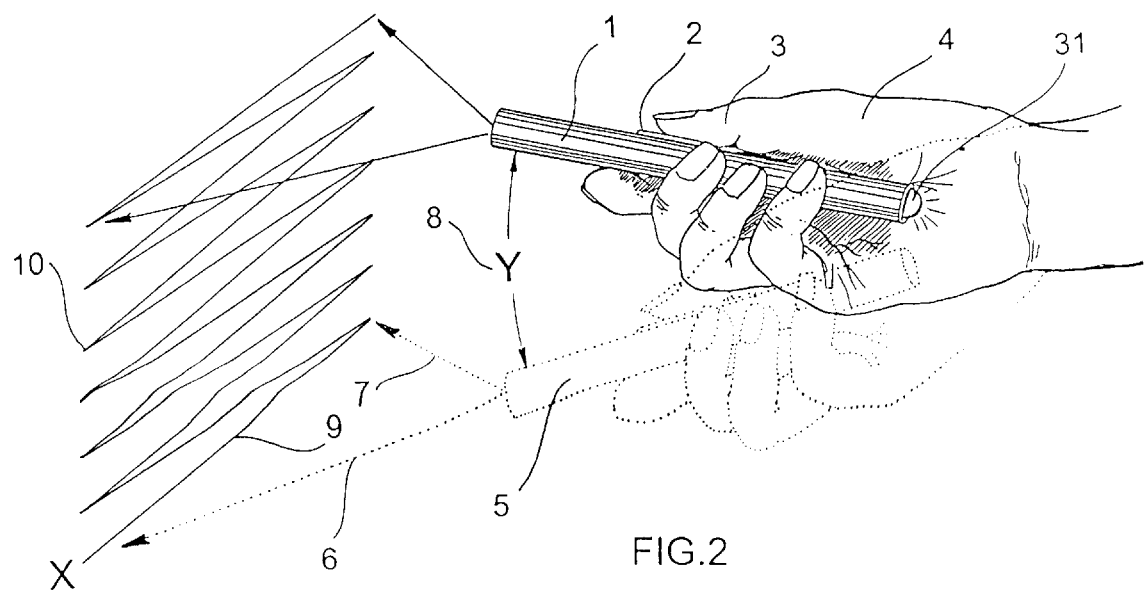
FIG. 2 illustrates a method of use, whereby the device can be moved by the hand to create a raster pattern.
Figure 3:
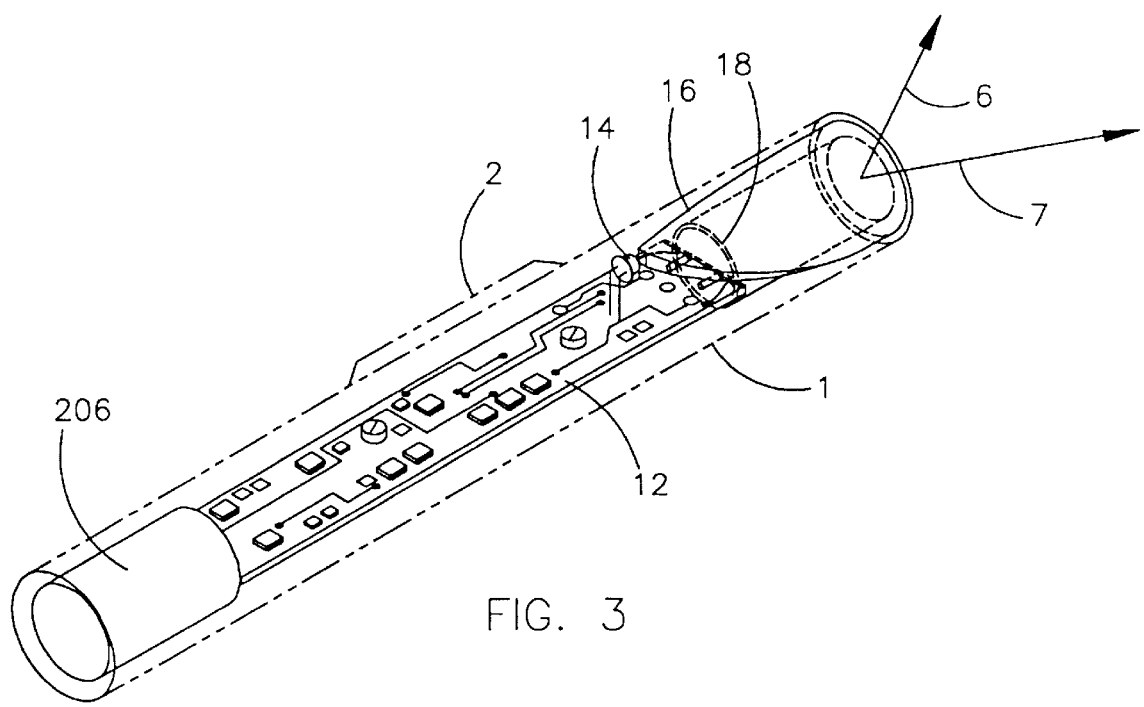
FIG. 3 illustrates one embodiment, showing the internal complement of components of a "fits-in-a-pen" scanner design.
Figure 4A:
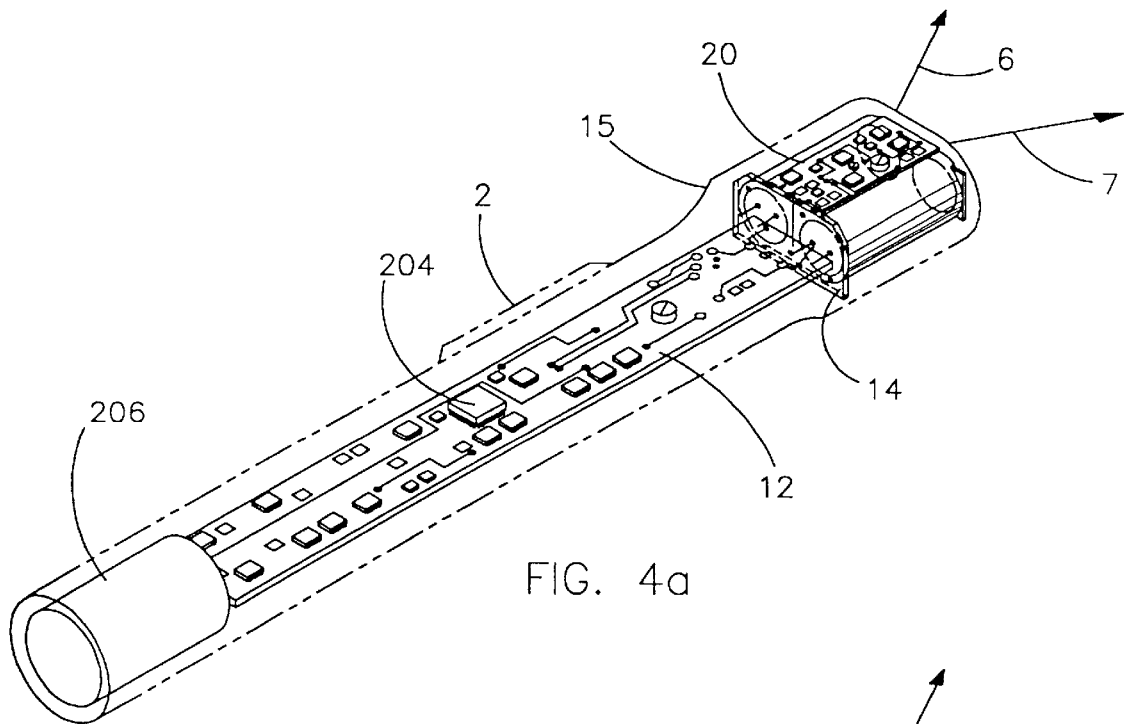
FIG 4a illustrates another embodiment, showing the internal arrangement of components and a scan head module.
Figure 4B:
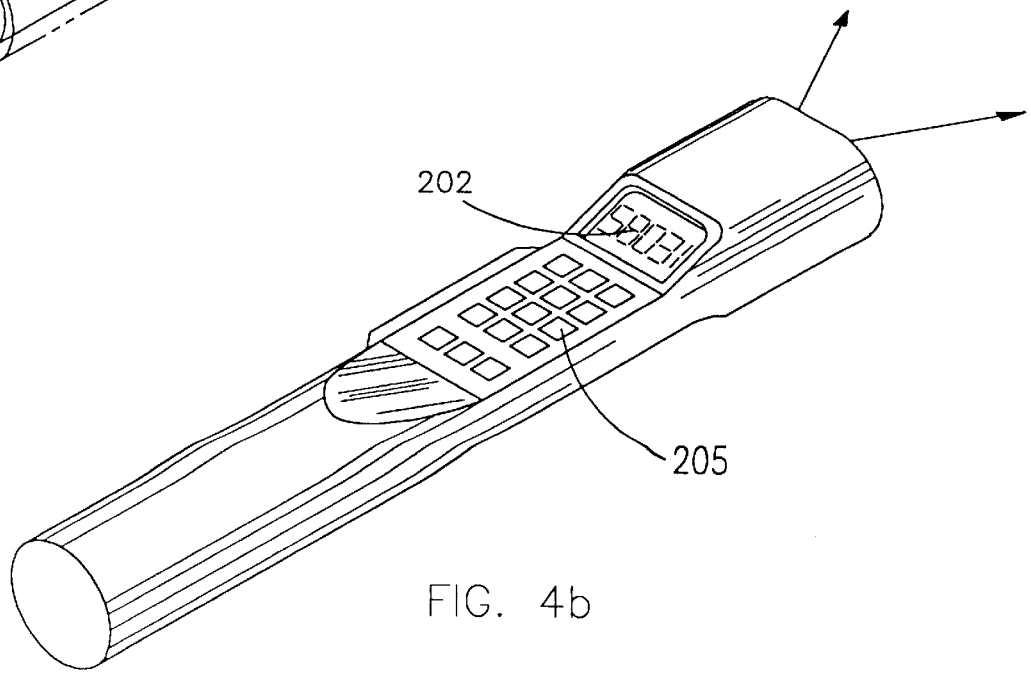
FIG. 4b illustrates a terminal style pen-size bar-code scanner.

The present invention provides a non-contact scanner which is housed in an elongated housing which can comfortably be grasped in the fingers in the same manner in which a pen is grasped, as shown in FIG. 1, or the manner in which a wand is grasped, as shown in FIG. 2. A pen-style housing 1 is shown in FIG. 1, which is elongated along an axis A and may conveniently have a length L along axis A of between about 5 inches and about 7 inches. The housing has a lateral dimension D which is sufficiently small, at least along a substantial portion of the housing length L, to enable the scanner to be grasped in the manner shown in FIGS. 1 or 2. Such condition is satisfied by a lateral dimension D of less than about one inch, preferably between about three-eighths and three-fourths of an inch, and most preferably between about one-half and five-eighths of an inch. The housing is generally cylindrical, and may be cylindrical as shown in FIGS. 1–3 or generally cylindrical with a non-circular cross-section as shown in FIGS. 4a and 4b.

The housing contains the operative components of the scanner. These components include means for generating a scanning beam, i.e. a moving beam of light, which is emitted at forward end 5 of the housing and during scanning moves about a neutral scanning axis S which is generally in the direction of the housing axis A, and is preferably parallel to axis A. The means for generating a scanning beam include a light beam source generating a light beam and a scanning element (sometimes referred to as a scan element) which receives and redirects the source beam to provide a moving scanning beam. In order to provide the capability of emitting wide angle scanning beams, the scanning element is preferably located near the forward end 5 of the housing. In order to minimize the lateral dimensions D of the housing, the light beam source is preferably disposed within the housing so as to direct the source light beam generally along the axis A of the housing. In this situation, the scanning element is an "axial" scanning element which receives the source beam along an axis and redirects it to provide a scanning beam along generally the same axis. The operative components of the scanner also include light receiving means for receiving light from a target (such as a bar-code) illuminated by the scanning beam and for converting the received light to an electrical signal which may be processed to obtain information therefrom. The light receiving means preferably receives light at the forward end 5 of the housing. It may be disposed coaxially with the scanning axis S or parallel and laterally adjacent to it. The operative scanner components housed within the housing may also include a power source such as a battery, means such as waveform generator for driving the scanning element, and means for processing the electrical signals derived from the received light to provide bar-code or like information.

The invention includes novel miniature scanning elements which are suited for to use in the pen-style and other miniature housings, particularly for use in generating a scanning beam travelling in the same direction as the source beam. These scanning elements are based upon a generally planar flexible member in which a gyrating motions are induced, as described below.

In application Ser. No. 07/776,663 a device termed a "gyrator" was described which executes a "gyrating" motion. The gyrator was an elongated member suspended at a pair of points along the member, the points defining a "Z" axis of gyration, which is an axis of quasi-cylindrical symmetry of the system. At least one of the suspensions coupled to the gyrator was flexible so as to permit points on the gyrator to move in an X and/or Y direction perpendicular to the Z axis, in arcs centered at a nodal point on the Z axis. Such movement about the X and/or Y axis was termed gyration, as distinguished from rotation about the Z axis. An optical element such as a mirror which is coupled to the gyrator will undergo angular deflections, and will cause a beam of light directed at it to be redirected as a scanning beam.

A mirror located at any point on the gyrator will undergo such angular deflections; if located at the nodal point; such deflections will occur without translation in the X or Y direction. However, a mirror so located would often be difficult to use in a scanning system because of its location.

Figure 18:
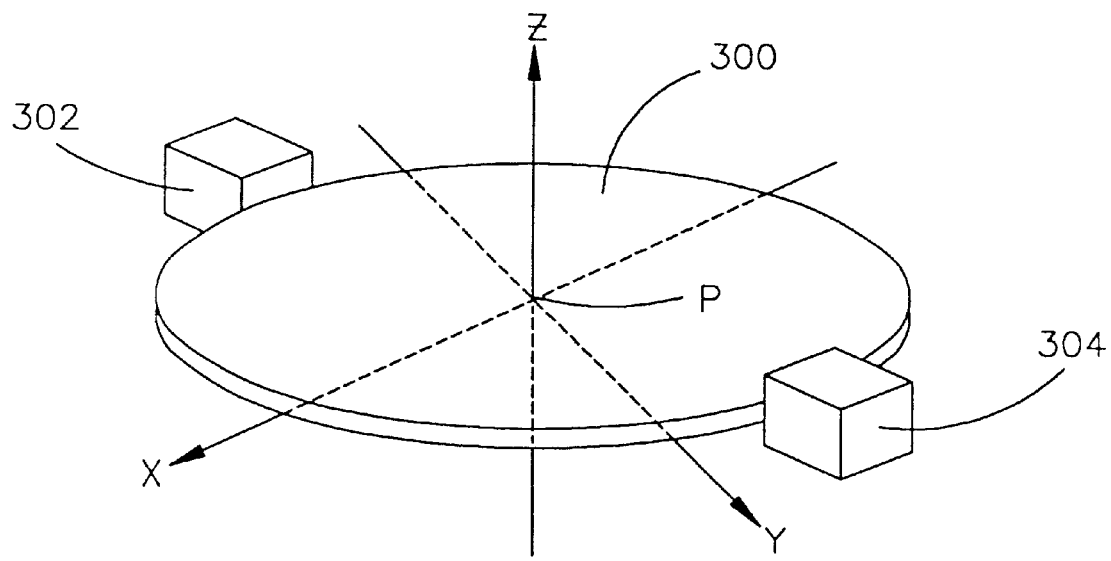
FIG. 18 is a schematic diagram of a generally planar flexible member which is supported to permit gyrating motion, which may be used in a scanning element.

A similar system can be provided in effect by collapsing the previously described gyrator along the Z axis until the suspension points are coincident. Using the preferred generally planar flexible members as suspension members, collapsing the prior system along the Z axis until the suspension points are coincident results in a system with only a single suspension member. Such a system is shown diagrammatically in FIGS. 18 and 19. FIG. 18 shows a generally planar flexible member 300 which is supported by support members 302, 304 at a pair of spaced apart locations on flexible member 300. Member 300, being planar, defines a plane containing a pair of perpendicular axes indicated as X and Y. The plane of member 300 defines a Z axis of the system which is perpendicular to that XY plane and to the X and Y axes.

While a workable gyrator could be made with the physical form shown in FIG. 18, it must be emphasized that FIG. 18 is highly diagrammatic. That is, while a planar member having a general circular periphery may be advantageously used, other peripheral forms may be employed. While the planar member may be membrane-like and continuous across its surface within its periphery, it may not be, as for example the flat springs shown herein. While the planar member may be supported at its periphery at many points or continuously along its periphery, it need only be supported at a pair of spaced apart locations, preferably at the periphery, so that points on the member generally adjacent or intermediate those locations may undergo the flexing motions described herein. While it is highly preferred that the flexible member be generally symmetric about the X axis and/or about the Y axis, it need not be.

Figure 19:
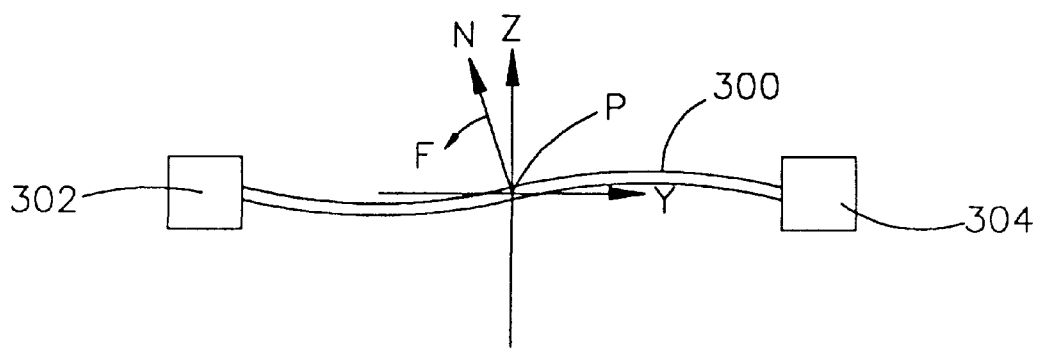
FIG. 19 is a schematic diagram of the device of FIG. 17, shown in a flexed condition.

As shown in FIG. 18, in an equilibrium condition, the member 300 is in its generally planar form, the normal to the surface at all points is generally parallel to the Z axis. When the flexible member is subjected to flexing force it will deform, departing from its generally planar condition, and in regions where the member is deformed, the normal to the surface of the member will depart from parallelism with the Z axis. Such a condition is shown in FIG. 19, in which the flexing force F is illustrated as a torque about the X axis (which axis is perpendicular to the plane of the paper at the nodal point P). Since the member 300 is flexible and resilient, it will respond to the torque by deforming to the illustrated condition, in which the normal N to the surface of member 300 adjacent nodal point P is rotated about the X axis and is disposed at a non-zero angle to the Z axis. An optical element coupled to member 300 in the region of nodal point P will undergo angular deflection in response to the torque force F on the member 300, whereby it may be used to receive and redirect a light beam. By varying the torque force F, the redirected beam provides a scanning beam. Because the member 300 is flexible and resilient, when deformed it generates a restoring force tending to return it to its equilibrium planar conditioning, the restoring force increasing with increasing deformation, defining a spring constant or function for deformation about the X axis. This spring constant or function, together with the moment of inertia of member 300 including any coupled members such as optical elements, defines a resonant frequency of the system. Thus, when excited by a periodic deforming force at the resonant frequency, the system will mechanically resonate in deformation at that frequency. When excited by a deforming force at a non-resonant frequency, it will deform at the driving frequency but in a non-resonant manner. The spring constants or functions for deformation about the X and Y axis need not be equal; if they are different, the system will exhibit different resonant frequencies about each axis. An optical element disposed at nodal point P will, upon deformation of the member 300, undergo rotation about the X and/or Y axis without translation. An optical element coupled to member 300 at nodal point P but displaced therefrom along the Z axis will undergo both rotation and translation. An optical element need not be coupled to member 300 at nodal point P in order to undergo a motion including a component of rotation about the X or Y axis; it may be coupled at any point where, in response to a deforming force, the normal to the surface where that element is coupled departs from the Z axis. In all of the foregoing cases, an element secured to the member 300 will, upon deformation of member 300, undergo a motion having a component of rotation about the X or Y axis, and is thus "gyration" as the term has been defined. It should be noted that the deforming force need not be a torque about nodal point P to effect such motion. For instance, a stress along the surface of member 300 may effect such deformation and gyrating motion, as described below with respect to FIG. 16.

Turning to FIG. 10 we see an axial scan element 80, capable of receiving a source light beam at either end along path 73A or 73C, and transmitting it out of the opposite end (along path 73C or 73A, respectively) as a scanned beam. The device is configured to accomplish this task with minimal space required for optical layout and is particularly suited for a simple in-line optical layout. Thus, the axial scan element is ideal for moving beam scan devices that can fit into wand-like, pen-like, or other miniature packages. This scan element is also capable of providing one or two dimensional scan patterns.

The operation of scan element 80 is explained referring to FIGS. 10, 11, and is as follows. A core element 50 is magnetized in the direction of arrow 50A and is attached to the central mounting area 60 of flexible suspension element 48.

In a best mode of the present invention and used in various embodiments is a novel suspension 48, as shown in FIG. 12. It is a generally planar flexible member, essentially a flat spring with generally serpentine arms 61A and 61B, which may be chemically machined from beryllium copper alloy. The serpentine arms 61A and 61B are secured to the peripheral area of the suspension at locations 88A and 88B respectively. The serpentine arms allow angular displacement of central area 60 about X-axis 64 and about Y-axis 63, as desired, either separately or simultaneously to achieve compound angular deflections. Since the serpentine arms of suspension 48 have a substantial length, large angular deflections of central mounting area 60 may be obtained in a very compact structure. Furthermore suspension 48 may be designed to have substantially different spring constants (and therefore different resonant frequencies) for deflection about the X-axis 64 versus the Y-axis 63. This feature may be achieved by selection of the geometry of the serpentine arms including by varying the thickness to width ratio of the serpentine arms 61A and 61B. Providing different spring constants in the X and Y directions is important when it is desired to generate oscillatory deflections only about the Y-axis or only about the X-axis. Thus when incorporated in the scanning mechanisms of the present invention and operated at different resonant frequencies for characteristic X or Y deflections these novel scanners can produce essentially perfect straight line scans in either the X direction or the Y direction. Alternately, when non-resonant frequencies are excited in this suspension by appropriate distortion means, as explained later, rasters, Lissajous figures, ellipses, and perfect circular scan patterns may be generated.

The magnetic core 50 will produce torque upon mounting area 60 when an electrical current is passed through coil 44. The angle through which the central area 60 rotates is generally proportional to the current passed through coil 44, the strength of the field emanating from the magnetic core 50, and is generally inversely proportional to the stiffness of suspension element 48. If an alternating current is passed through coil 44, the magnetic core 50 will execute oscillatory angular displacements through angles generally less than +/−90 degrees at the frequency of the applied current.

A mirror 52 is attached to a wedge shaped mounting block 51, which is in turn fixed to the central portion 60 of flexible suspension element 48 so as to be disposed at an angle with respect to the plane of suspension 48. A second mirror 46, generally parallel to mirror 52, is also fixedly mounted to the frame 81 of axial scan element 80. Mirrors 52 and 46 define an optical path along which a light beam received from a light source is redirected. A beam of light directed axially into scan element 80 along path 73A, parallel to or collinear with Z-axis 83, will reflect off mirror 52, follow path 73B, then reflect off mirror 46, and proceed along path 73C through passage 49 provided in suspension 48. The beam exiting along path 73C remains generally parallel to and proceeds generally in the direction of the source beam Z-axis 83. Mirrors 52 and 46 can be quite small, on the order of 3 by 3 millimeters, and may be relatively close together. Thus paths 73A, and 73C, are generally parallel and laterally displaced very little from one another.

Now turning to FIG. 11, it is seen that if the magnetic core 50 is caused to execute small angular deflections in response to changing current in coil 44, thereby angularly deflecting mirror 52, a beam entering along path 71A may be caused to undergo deflections as depicted by rays 70, and 72, about a neutral direction 71B. Thus axial line scanning is achieved.

It has also been found that if the current applied to coil 44 is simply a series of low duty cycle current pulses having a period corresponding to a resonant frequency of the suspension and the mass attached to mounting area 60, large angular oscillating deflections may be produced with very little energy input. Such pulses may be single polarity current pulses at about the resonant frequency. Typically only a few milliwatts of power is required to generate wide angle deflections capable of producing scans on the order of 100 degrees. (Such wide scan angles are useful when the device is employed to scan bar-codes only six or eight inches away.)

Figure 8:
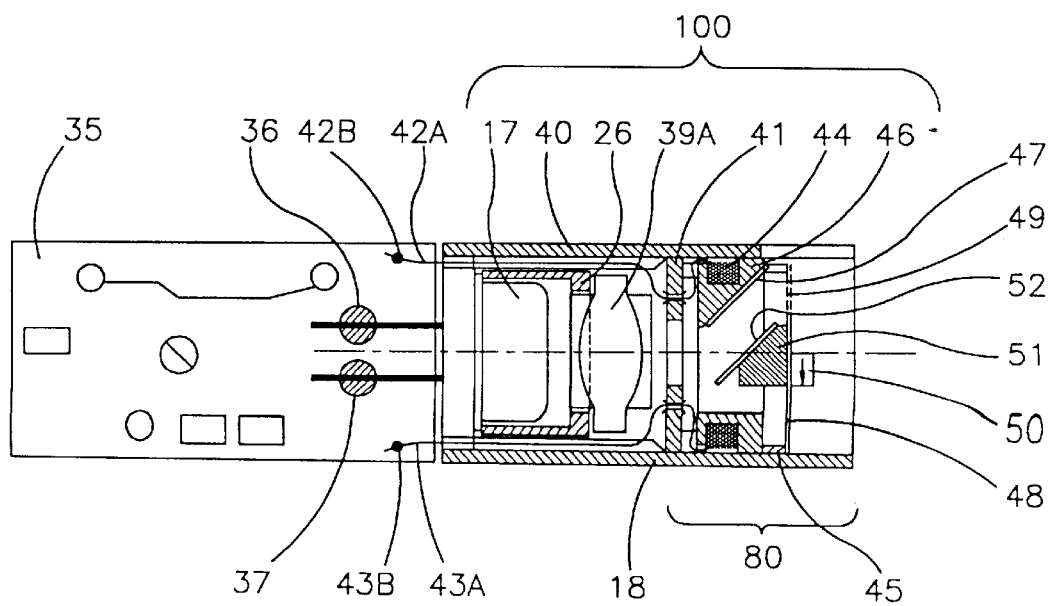
FIG. 8 illustrates an integrated cylindrical axial scan module, showing the internal electro-optical components.

By virtue of the fact that light may be made to enter either end of the axial scan element 80, the device can be operated in two different modes. In the instance where the beam is caused to enter the device and first impinge upon fixed mirror 46, then reflect off moveable mirror 52, the largest scan angles are possible. However, the simplest optical mounting method is to mount a light source 17 and scan element 80 coaxially, as shown in FIG. 8, to form an integrated scan module whereby the beam is first reflected off the moveable mirror. In this mounting configuration adequate scan angles on the order of 45 degrees are achievable.

NON-MAGNETIC DISTORTION MEANS

Figure 15:
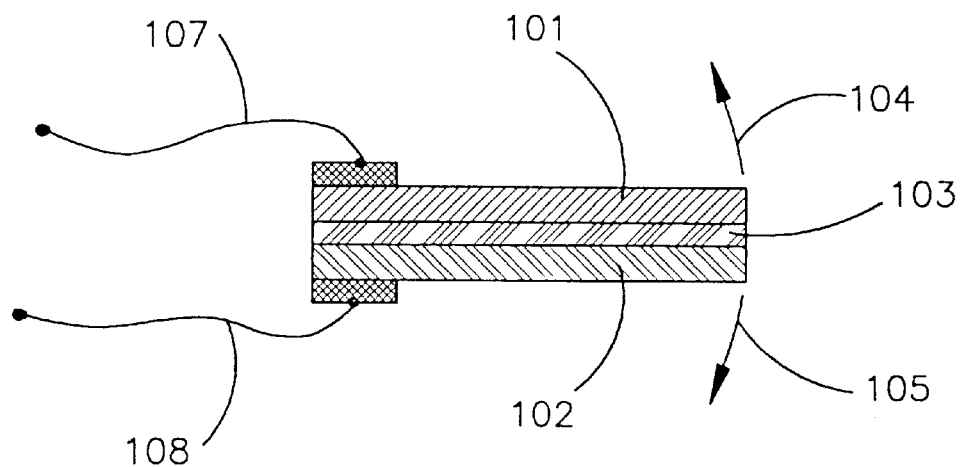
FIG. 15 illustrates a non-magnetic piezoelectric bender.

A piezoelectric bender is an electromechanical transducer capable of converting electrical into mechanical energy. A simple single layer piezoelectric bender is illustrated in FIG. 15. It consists of a piezoceramic layer 101, with a conductive outer coating on its surface attached to terminal 107, a thin conductive layer 103, which may be a conductive adhesive bonded to a flexible substrate 102, such as a thin metal layer having an electrical terminal 108. An electric potential applied between terminals 107 and 108 causes one layer to expand while the other contracts, resulting in a bending displacement in either direction 104 or 105 (depending on the polarity of the applied potential), which is much greater than the length deformation of either of the two layers.

Multi-layer benders can achieve greater deflections than single layer devices. Typical deflections for a double layer bender are on the order of 0.05 mils of deflection per volt per inch of length. This would be considered undesirably small, however, if one were to simply attach a mirror to a straight bender to obtain angular deflection for the purpose of scanning a light beam. Of course, the length of the bender could be extended in length to get larger deflections, but compactness is sacrificed and the mirror would undergo undesirable lateral translations, eventually moving the mirror out of the beam. Also, the increased length of the extended bender increases the moment of inertia of the moving system, thereby slowing down the scan rate.

Figure 16:
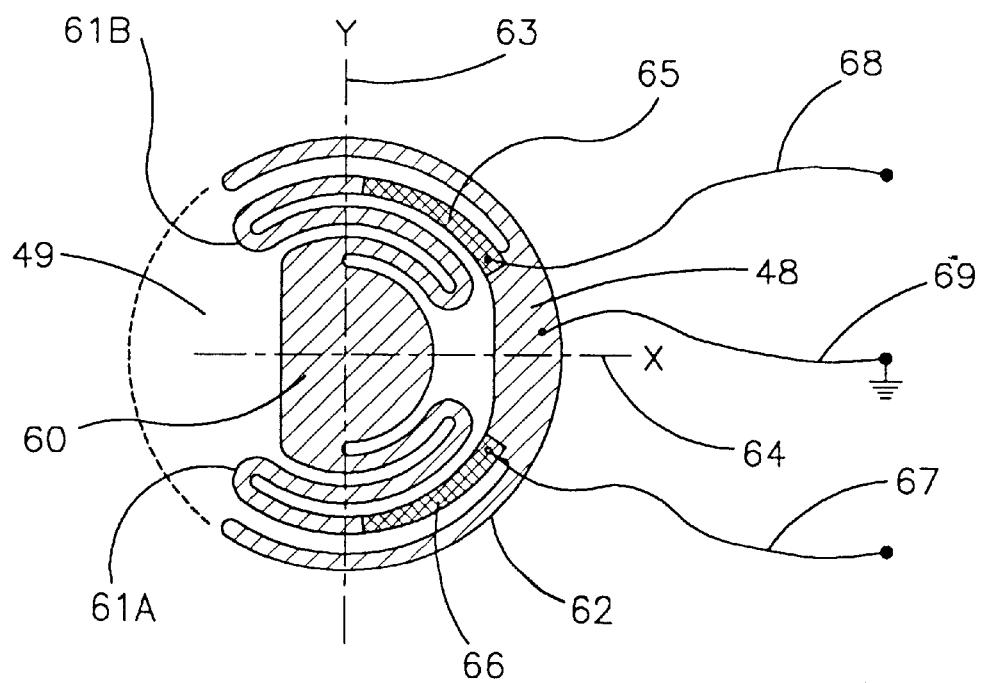
FIG. 16 illustrates a suspension incorporating a piezoelectric bender as a distortion means.

The aforementioned problems may be overcome, however, if piezo-benders 65 and 66 are integrated into the structure of suspension 48, as shown in FIG. 16, by applying them to portions of the arms. Now if the benders 65 and 66, are excited by applying an alternating electric potential to them at a resonant frequency of the suspension with a mirror attached to central mounting area 60, the mirror can be induced to undergo very large rocking angular deflections with hardly any lateral translation at all. Thus a wide angle scan mechanism of very small size and very high speed may be so constructed. Further details of the construction and operation of this novel scan mechanism are described as follows.

In the device of FIG. 16, piezoelectric elements 65 and 66 are bonded to a small portion of serpentine arms 61A and 61B of suspension element 48. Electrically conductive beryllium copper is a preferred material for suspension 48, with electrode 69 attached to it. Thus, such a conductive metallic suspension provides the function of substrate 102 shown in FIG. 15. Electrodes 68 and 67 are attached to a conductive coating on top of piezo elements 65 and 66. A flexible conductive silver filled epoxy may be used for the bonding agent.

When electrical pulses are applied between common terminal 69, and terminals 67 and 68, at a resonant frequency for angular deflection about the Y-axis 63, very large angular oscillations of central mounting area 60 will occur and, since the mounting area 60 undergoes very little translation, the resultant low moment of inertia of the mass-spring system can provide very high scan rates that can be thousands of scans per second, depending on the compliance of the suspension. Of course, a less stiff material can be chosen for the suspension, such as metallized plastic film, if very low speed scanning is desired.

If electrical potentials are supplied to terminals 67 and 68, which are 180 degrees out of phase at a resonant frequency for deflections about the X-axis, a line scan can be produced which is perpendicular to that obtained for deflection about the Y-axis 64. Since the resonance frequencies for these two perpendicular motions are typically different, unwanted modes of excitation can be eliminated by operating the device at the selected resonant frequency, thereby producing either an X direction scan or a Y direction scan from the same scan device as desired.

By choosing a frequency of operation different from that required for line scanning, or by mixing frequencies or phase shifting them, various two dimensional scan patterns may be produced.

This novel piezo-driven scan device can be incorporated into scanners described herein and may be combined with the electromagnetically driven ones to form hybrid devices. They can be fabricated so they require very little space; for example, dimensions of less than one half inch in diameter and one eighth inch thick are practical, and these can deliver one or two dimensional wide angle scans of various orientations.

LOW SPEED LINE SCANNING

Some bar-code reading applications only require low speed straight line scanning at rates less than 100 scans per second. Also, small low cost microprocessors dedicated to slow speed bar-code decoding at these speeds are available. Thus, an economical axial scan element is described for use in lower speed but very important commercial applications.

In order to obtain low scan rates using the suspension in FIG. 12, it would be necessary to have numerous folds in the serpentine arms such as 61A and 61B to reduce its resonant frequency. Unfortunately, too many folds can cause unwanted bounce (translation) along Z-axis 83 of FIG. 10, leading to poorly defined straight line scans. To overcome this drawback and obtain only one dimensional straight line scans at low frequencies, a ribbon suspension 55, consisting of a thin ribbon of plastic film, is employed as shown in FIG. 9. This suspension 55 is a generally planar flexible member lying in the XY plane which is supported at a pair of locations by frame 45 so that intermediate locations, including the central area where mirror 52 and magnetic core 50 are located, can gyrate about the Z axis. Typically a one mil (0.001 inch) thick by thirty mil wide flat ribbon of polyester or polymide film stretched across a 0.360 inch coil frame 45, forms a suspension with a low torsional constant. When ribbon suspension 55 is loaded with an essentially iron bearing magnetic core 50, of dimensions 0.125 inch×0.125 inch×0.05 inch thick and a small mirror 52, approximately 9 square millimeters, straight line scans at rates under 100 scans per second may be obtained while eliminating unwanted bounce modes of oscillation. Arrow 56 of FIG. 9 indicates a displacement, which is an angular displacement about the X axis resembling a rocking action obtained using ribbon suspension 55, to generate a straight line scan. The suspension 55, illustrated in FIG. 9, may be incorporated in an axial scan element such as that of FIG. 10 which allows light to pass through the element on either side of ribbon suspension 55.

Figure 20:
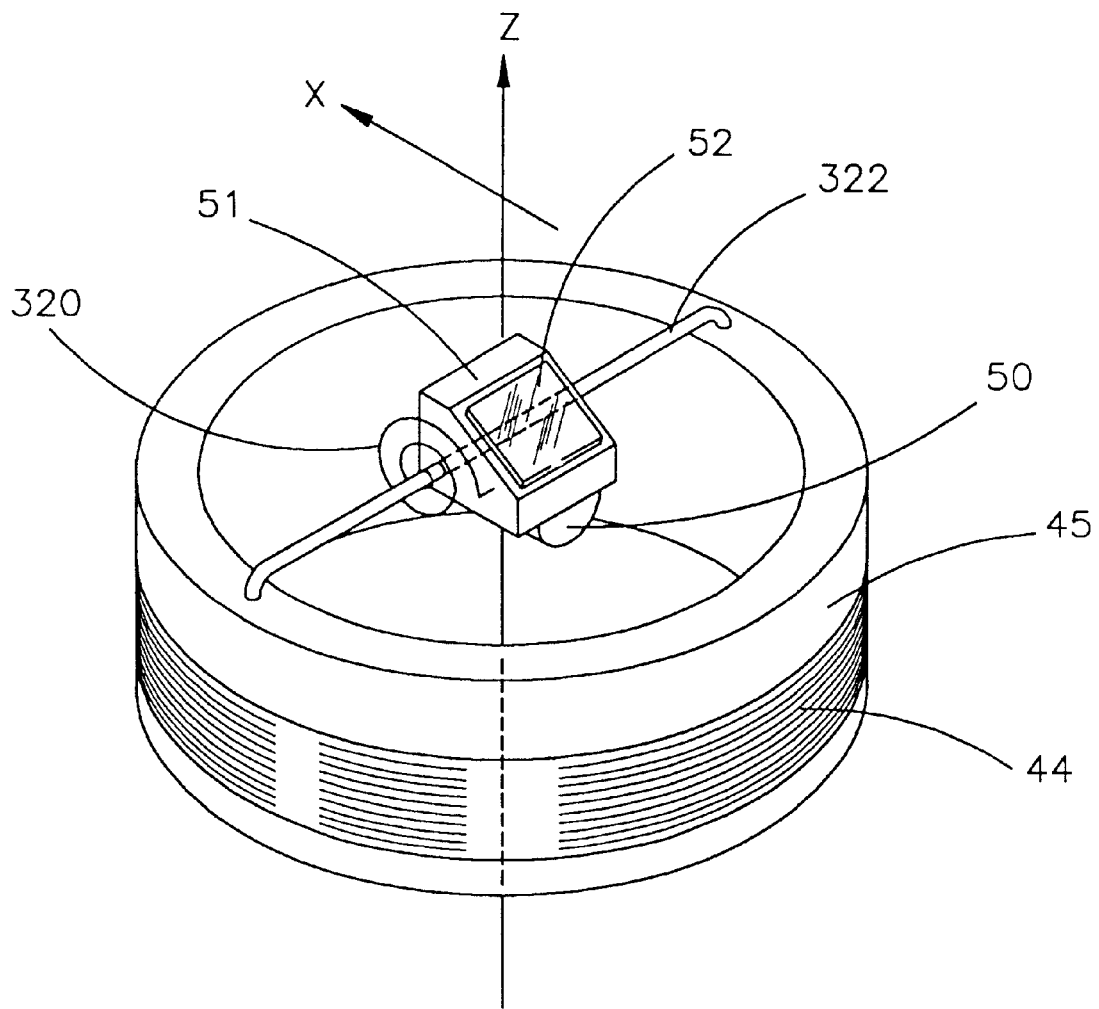
FIG. 20 shows a scan mechanism which is suitable for low speed line scannings.

An alternate scan element for ultra-low speed scanning on the order of thirty scans per second is illustrated in FIG. 20, in which mirror mount 51 is suspended on a wire 322 so that it may freely rotate thereon with minimal friction. Wire 322 has its opposite ends anchored to frame 45. A preferred material for mirror mount 51 is a dry lubricated thermoplastic with ten to twenty percent PTFE powder and approximately two percent silicone lubricant, whereas the wire is preferably passivated stainless steel.

One end of small spiral spring 320 is attached to suspension wire 322 and its opposite end is attached to mirror mount 51 to provide a restoring force. In this embodiment the wire serves to greatly reduce bounce of mirror mount 51 in unwanted directions.

INDEPENDENT MULTIDIMENSIONAL SCANNING

Figure 17:
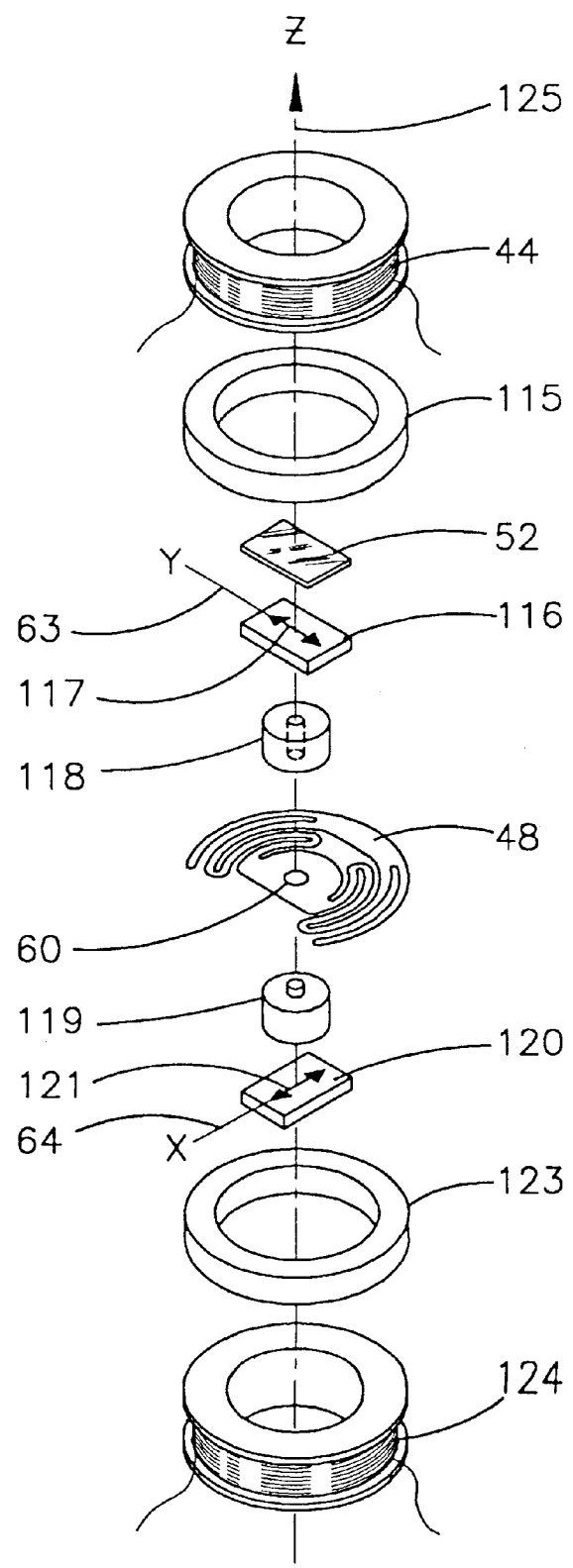
FIG. 17 is an exploded view of component parts of a two-dimensional scan element with independent X-Y control.

Now turning to FIG. 17, a scan element capable of producing independent two-dimensional scan patterns with independent X and Y dimensional control may be understood.

Suspension 48 is capable of angular deflections about X-axis 64, and/or Y-axis 63, with respect to perpendicular Z-axis 125. Suspension element 48 has spacers 118 and 119 attached to its central mounting area 60 two, one spacer being mounted to each side thereof. To each of the spacers 118 and 119 is mounted a magnetic core (116 and 120, respectively). Cores 116 and 120 are permanently magnetized in generally perpendicular X and Y directions represented by arrows 117 and 121, respectively. The magnetic cores 116 and 120 each interact independently with their respectively corresponding coils 44 and 124, to yield independently controllable components of motion which need not be at a resonant frequency as previously explained. The ring spacers 115 and 123 provide separation of coils to substantially reduce unwanted interaction of their fields with one another as well as with non-corresponding cores 116 or 120.

When a light beam is reflected off mirror 52, attached to magnetic core 116, independent X-Y two dimensional scanning is achieved. Of course non electromagnetic means may be used such as the piezoelectric method previously described to provide a distortion force in one of the dimensions which would be totally free of interaction with an electromagnetic one in the perpendicular direction.

Of course mirror 52 may be mounted on a wedge type mount and a second mirror added such as mirror 46, as depicted in FIG. 10 in order to produce an axial style gyrator with independent two dimensional scan control.

MULTIDIMENSIONAL AXIAL SCANNING

Turning again to FIG. 12, a geometry for a preferred flat suspensional element 48, is illustrated which is symmetrical with respect to X-axis 64. If magnetic core 50 is excited so that it is caused to execute resonant oscillatory angular displacements about Y-axis 63, these oscillations will cause scan element 80 to generate a virtually perfect straight line scan with very little energy input as previously described. The suspension element 48, can also execute oscillatory angular displacements about X-axis 64, as well. But these occur at a different frequency, generally a higher frequency than those resonant deflections that can occur about the Y-axis 63.

If current is supplied to coil 44 of the device shown in FIG. 11, at a frequency suitable for oscillatory deflection about the X-axis 64 of suspension 48, a scan line may be produced which is perpendicular to the lower frequency scan line generated by pivoting central area 60 about Y-axis 63.

Because the magnetic field lines emanating from magnetic core element 50 have components that emerge as curved lines of flux from its pole faces, it is possible to stimulate vibrations in two mutually perpendicular directions using the design of suspension 48, which provides different resonant frequencies for deflections about the X and Y axes. Also, if magnetic core 50 is very slightly skewed from the position shown in FIG. 12, stronger torque may be more efficiently produced to sustain motion at the appropriate resonant frequency about either X-axis 64 or Y-axis 63.

If the magnetic core 50 is stimulated by current at a frequency which lies between the two resonant frequencies mentioned above, a mechanical phase shift for driving the mass-suspension system consisting of core 50, mirror assembly 52, mirror mount 51, and suspension 48, will occur. In particular, the mass-suspension system will exhibit a significant lag between drive current and mechanical response for oscillatory angular deflection about the axis possessing the higher resonant frequency. As a result an elliptical scan pattern will result when a light beam is reflected off mirror 50, since it may be caused to have both X and Y components of deflection. By adjusting parameters of the mass-suspension system and drive current, the ellipses may be virtually perfect circles. These scan patterns are useful for bar-code systems which must scan round items such as automobile tires or for a novel laser highlighter described later.

If current at two or more frequencies is applied simultaneously to coil 44 of FIG. 11, then two dimensional scan patterns such as Lissajous figures or other omni patterns may be generated, which if used in a bar-code reader can reduce requirements to orient the code.

In order to generate high density raster patterns with closely spaced lines (not a Lissajous figure) it is necessary to move the beam slowly, at 12 Hz for example in one direction and hundreds of Hz in a mutually perpendicular direction. A best mode for accomplishing this effect is to apply a first strong alternating current at the desired low frequency with a triangular wave form to coil 44, so that magnetic core 50 executes oscillation about Y-axis 63 of suspension 48. When the low frequency is well below resonance in this direction a stronger current is needed to produce motion than is required for resonant operation. (This is known as the broad band mode.) At the same time a second alternating current may be superimposed on the first which is applied at a much higher frequency of several hundred Hz to produce resonant oscillatory rotations about X-axis 64. (Generally this second resonant frequency is above the resonant frequency for deflection about the Y-axis.) In this way a two dimensional raster scan pattern may be produced when a beam is introduced into the scan element.

DUAL SUSPENSION GYRATING AXIAL SCAN ELEMENT WITH INDEPENDENT X-Y DIRECTION CONTROL

Figure 13:
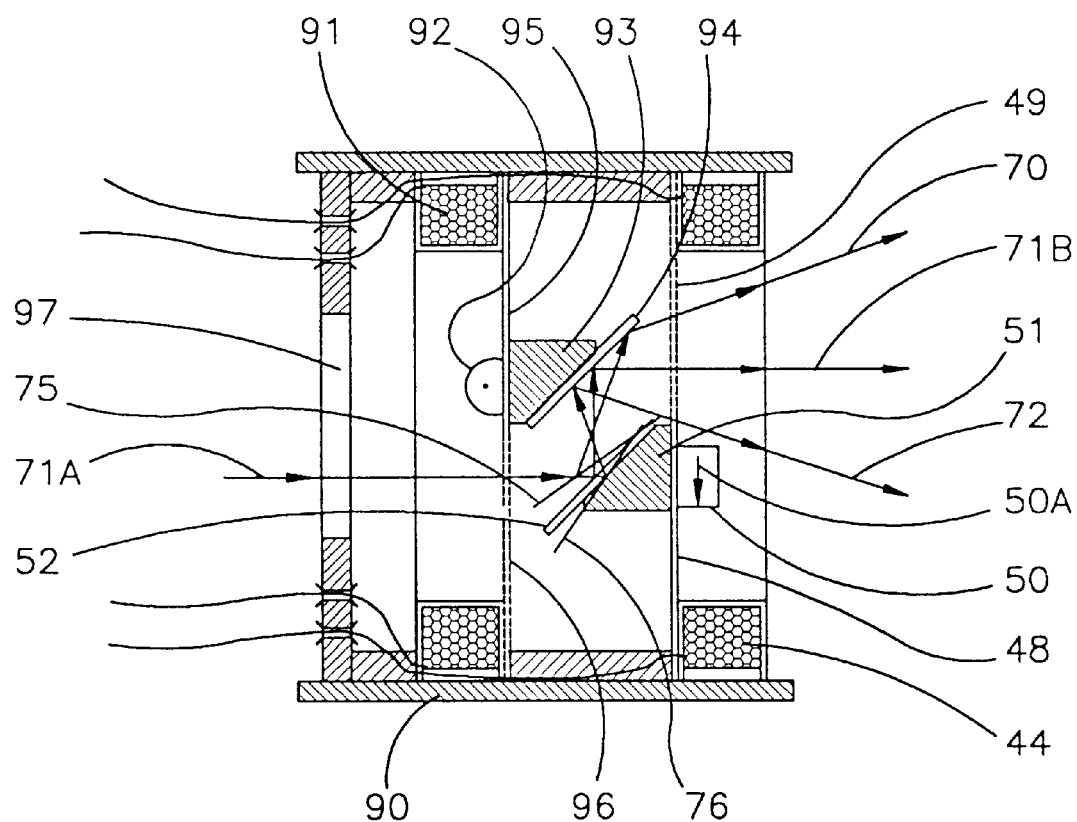
FIG. 13 illustrates an axial scan element with two moving mirrors arranged to produce independent two dimensional scanning.
Figure 14:
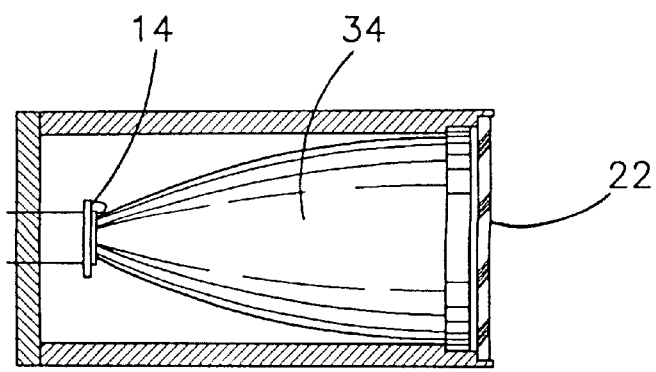
FIG. 14 illustrates a non-imaging compound parabolic light concentrator with photoelectric converter.

A dual suspension variety of an axial scan element, shown in FIG. 13, operates like those previously described, but in this case, no fixed mirror is used. Rather, two moving mirrors 94 and 52 are mounted on separate suspensions 95 and 48, respectively which in turn are independently moved by magnetic cores 92 and 50, in conjunction with separate drive coils 91 and 44. Note that for the preferred embodiment illustrated in FIG. 13 the magnetic cores 92, and 50, are magnetized in mutually perpendicular (X-Y) directions. Again this axial scan element may be operated by injecting a light beam at either end after which it will emerge from the opposite end as a scanning beam. Illustrated in FIG. 13 is an incoming beam 71A, which is shown scanning through an angle included between outgoing beam directions 70 and 72. Similar angles of scan perpendicular to the view of FIG. 13, i.e. in a plane perpendicular to the page, are possible but not illustrated to avoid confusion in the diagram.

The axial scan element shown in FIG. 13 in which two independent dimensions of scanning may be achieved need not depend on operation at resonant frequencies of suspensions 48 and 95, and can produce a greater palette of two dimensional scan patterns than the single magnetic core axial scan elements. For example, a wider range of raster speeds may be produced and Lissajous figures may be simultaneously developed by the each of the two independent suspensions 48 and 95, moving a single spot of light in remarkably high speed, dense, omnidirectional scan patterns, thereby eliminating the need to orient bar-codes prior to scanning them.

Multiple frequencies and waveforms can be fed to each coil while techniques such as phase shifting, amplitude modulating as well as phase shift keying may be used to produce a vast palette of useful omnidirectional scan patterns from this scan element.

HAND APPLICATIONS AND RASTERING METHOD

The pen-like scanner 1, held as illustrated in FIG. 1, is ideal for close non-contact scanning such as when the user is seated at a counter. Switch 2 is provided on the device to activate the scan sequence. The conveniently mounted switch 2 may have multiple positions for selecting various scan patterns and scan angles. Switch 2 can be used to operate the scanner either continuously or intermittently to save power. In addition a tilt type mercury switch or accelerometers may be incorporated into the scanner to activate it automatically during use. Since the axial scan elements used in the pen type scanners described herein, as well as the electronic components, consume very little power it is intended that these scanners can be operated from small batteries 206, included in the housing of these scanners for cordless operation.

In the cordless mode of operation, where the scanner is configured as a bar-code reader, information may either be stored in a nonvolatile memory within the pen for downloading later or it may be transmitted by wireless means to a host terminal located remotely using well known schemes for radio frequency or infrared data transmission. An infrared emitting diode 31, located at the back end of a pen shown in FIG. 1, is an ideal location for a typical cordless data link.

The use of high Q, stiff beryllium copper springs of the type depicted in FIG. 12, make possible axial scan elements capable of hundreds of scans per second. When used in a pen scanner, highly effective, dense, raster patterns may be produced by simply holding the pen scanner as illustrated in FIG. 2 and moving the wrist vertically along Y-axis 8. This method is ideally suited to low cost pen-size bar-code readers capable of reading two dimensional bar-code.

SELF CONTAINED AXIAL SCAN MODULE

Scan modules which contain a light source, scan element, and light receiving means in a self-contained package suitable for use as a component or subassembly are highly desirable. Using the previously described elements complete scan modules can be built which have a volume less, and in some cases substantially less, than one cubic inch.

Now turning to FIG. 8, a compact axial beam scanning module 100 is depicted. Axial scan element 80, capable of one or two dimensional scanning is included in module 100. The coil leads 42A and 43A from the scan element 80 are terminated on circuit board 35 at pads 42B, 43B, and appropriate combinations of waveforms generated from circuits on the board 35 are supplied to coil 44.

A beam focusing element 39A is located behind the scan element 80. It should be noted that the beam focusing element 39A may be a lens, a hologram, an axicon or combinations of such devices with aperture stops and the like to focus and shape the beam from light source 17. In a preferred mode of the present invention, light source 17 is a laser diode. However light source 17 need not be a laser diode. It has been found that for short range (several inches away) non-contact scanning, a bright light emitting diode (LED) with a small aperture and lens combination is sufficient to read bar-codes. An LED version of the scan module, although not capable of the longer range capability of laser diodes, is very cost effective for many close range non-contact applications. At the current time light emitting diodes cost about one tenth as much as laser diodes and can be operated with simpler drive circuitry.

Light source 17 is supplied power from and is controlled by well known circuits also located on circuit board 35. Leads from the light source 17 are soldered directly to circuit board pads 36 and 37. A cylindrical housing 18 houses the light source, focus element and axial scan element. Housing 18 may be made from black anodized aluminum to dissipate heat from the base of light source 17. The entire assembly of FIG. 8 has been successfully fabricated with a diameter of just slightly greater than 9 millimeters, the diameter of the most common commercial laser diodes. Eventually smaller laser diodes which are only 5.6 millimeters in diameter may be used with a very miniature focus element 39B (see FIG. 6) such as a 1 millimeter diameter gradient index lens for even smaller scan modules. An integrated in-line scan module fabricated into a small diameter cylindrical package as described above is well suited for use in beam scanning pens, bar-code readers, industrial sensors, and as instruments for object detection.

Figure 7:
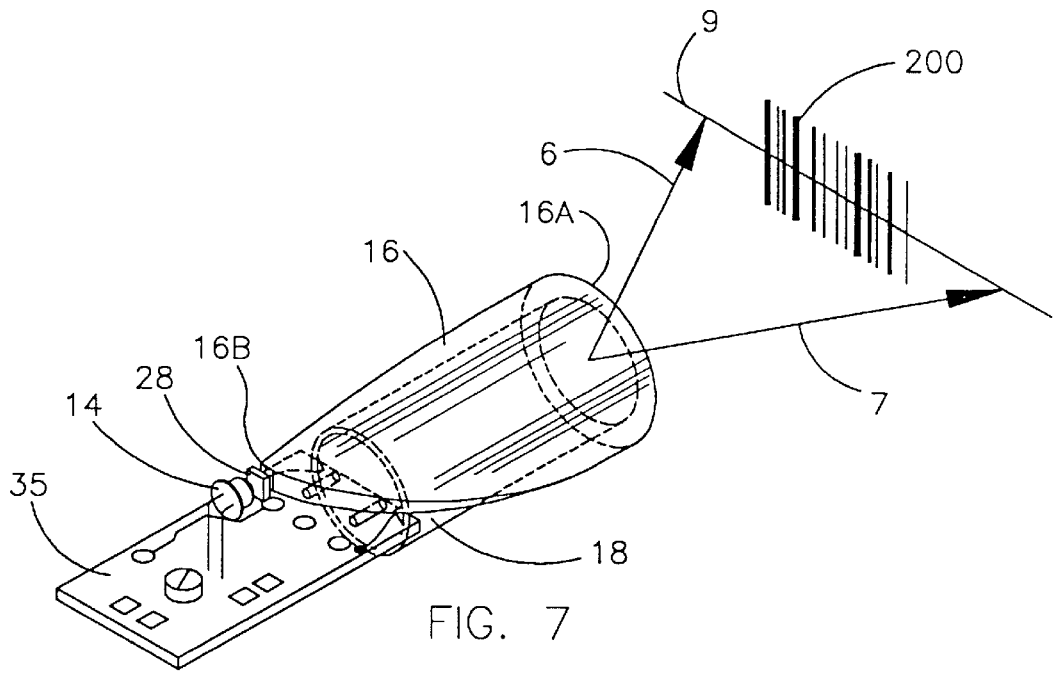
FIG. 7 illustrates another embodiment, showing the use of a coaxial light collector with an axial scan module.

Now turning to FIG. 7, a further addition is made to the in-line scan module of FIG. 8, namely a non-imaging coaxial light concentrator 16. The non-imaging coaxial light concentrator 16 has been described in another Patent Application for an Electro-Optical Scanning System with Gyrating Scan Head, Ser. No. 07/776,663, filed by the same applicant. The non-imaging light collector functions by accepting light returned from a scanned target at its front end 16A, and concentrating the light by means of internal reflection to small exit area 16B, where the concentrated light is directed upon photo electric converter 14. Light from a scanned spot forms scan line 9, which passes over a target 200, whereupon the reflected light is then collected by the front of coaxial light concentrator 16, and is eventually reduced to electric signals by a photoelectric converter 14, such as a photo diode. The signals are then processed into usable information by circuitry on circuit board 35. Scan module 100 fits within coaxial light collector 16, to form a compact cylindrical assembly for incorporation into a pen size scanner such as depicted in FIGS. 3 and 1.

Figure 5:
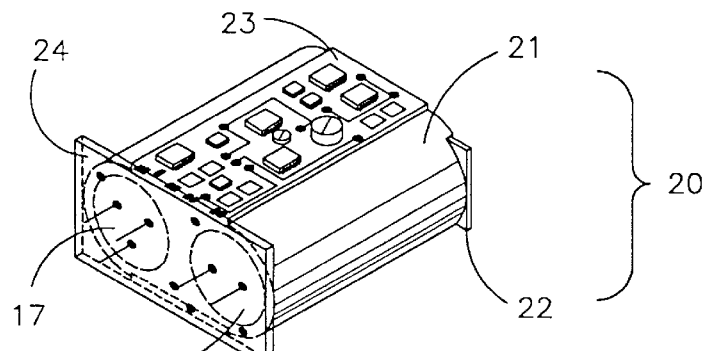
FIG. 5 illustrates an embodiment, where an entire scan module is integrated into a monolithic block-like chassis.

The axial scan engine module of FIG. 5 is similar to that of FIG. 7, but is configured for decreased length when additional length is needed for batteries and terminal parts. The light source 17, axial scan element 80, light concentrator 34, and photo detector 14, are all compactly mounted within a monolithic chassis 21, and circuit boards 23, 25 and 24 which control the components are mounted to its external surfaces allowing for heat dissipation and ease of service.

Figure 6:
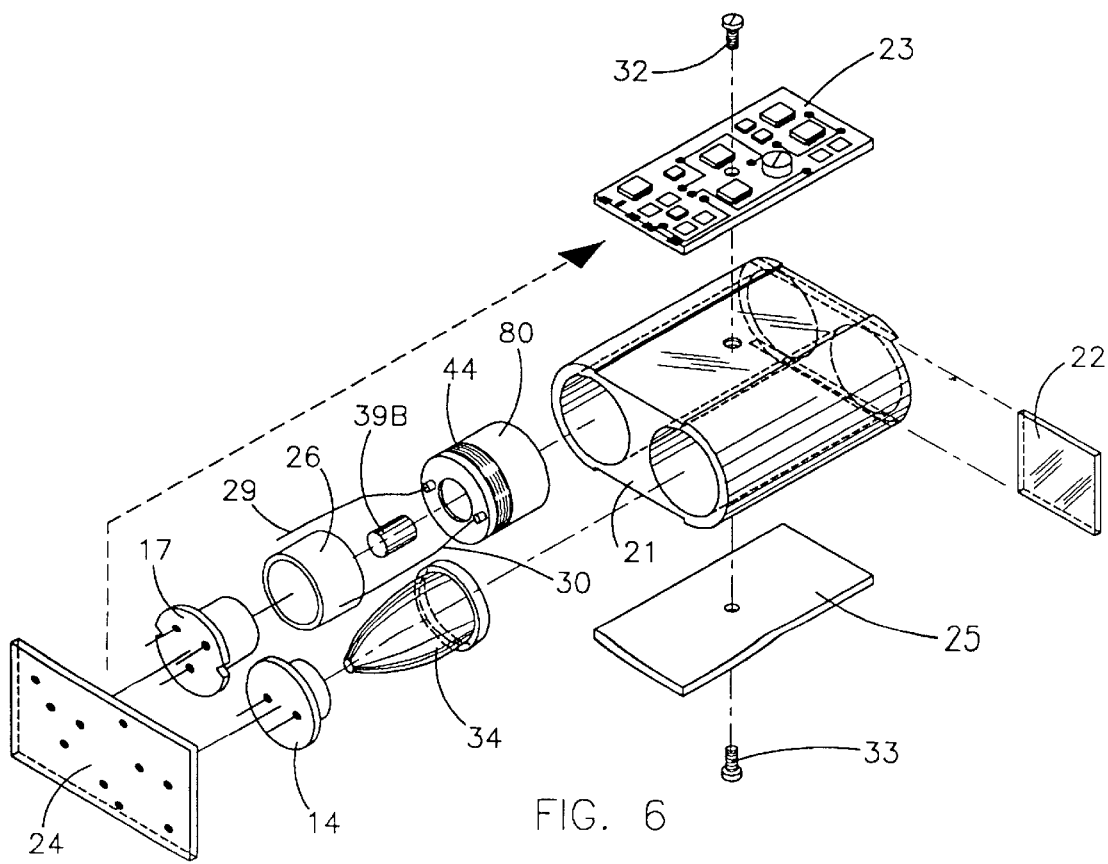
FIG. 6 illustrates an exploded view of FIG. 5.

The single piece monolithic housing 21 may be made from a single piece of aluminum if necessary to remove heat from light source 17, especially if it is a laser, and serves to house, mount and align all critical components of the scan engine module. Light concentrator 34 may be a positive condenser lens but in a preferred embodiment of the present invention it is a non-imaging light concentrator, namely a compound parabolic concentrator made from a transparent solid dielectric such as plastic, which concentrates light by internal reflection upon a photo diode 14. Such compound parabolic concentrators (CPCs) can theoretically concentrate light onto surfaces one fourth the area possible by imaging lenses, thus a small junction photo diode may be used for photo detector 14, to yield ultra high speed, low noise signal detection. Optical band pass filter 22, placed in front of the CPC 34, removes wavelengths of light different from that emitted by monochromatic source 17, thereby improving signal to noise ratio of the photo detector 14 output. A gradient index lens 39B is also shown in FIG. 6 as an example of a light focusing element with a small numerical aperture in which an aperture stop is not necessary to provide a small spot of light with a large depth of field on the target to be scanned.

An embodiment of the axial scan engine module is illustrated in FIG. 5, and may be conveniently incorporated into a narrow scanning pen 300, with terminal features as shown in FIG. 4. In this embodiment, the pen has a display 202, for providing human readable output from scanned bar-code. A small key pad such as those found on calculator style wrist watches may also be incorporated on this device to provide input such as numbers of identical items scanned, cancellation of a scanned input and the like. Such a device may be designed with a microprocessor 204, and memory means for retaining and processing scanned data. This embodiment would be admirably suited to package delivery industries, inventory applications, and portable hospital information reading applications, where extreme portability of non-contact bar-code reading terminals would be desirable.

DYNAMIC LASER POINTER AND HIGHLIGHTER

The scan module of FIG. 8 may be mounted in a pen-size housing without photo electric light converter 14, and used as a dynamic laser highlighter. Prior art laser pointers can only produce spots of light on a target, however the dynamic highlighter using the scan module of the present invention can produce elliptical and line scan patterns. This feature is useful in highlighting projected images, printed graphics and objects.

It will be understood that each of the elements described above, or two or more together, also may find a useful application in other types of constructions differing from the types described above.

While the invention has been illustrated and described in the embodiments above, it is not intended to be limited to the details shown, since various modifications and structural changes may be made without departing in any way from the spirit of the present invention.

Without further analysis, the foregoing will so fully reveal the spirit of the present invention that others can, by applying current knowledge, readily adapt it for various applications without omitting features that, from the standpoint of prior art, fairly constitute essential characteristics of the generic or specific aspects of this invention and, therefor, such applications should and are intended to be comprehended within the meaning and range of equivalence of the following claims.

What is claimed is:

1. A device for providing angular displacement of a light beam in a direction selected from the X and Y directions with respect to a Z-axis, comprising:
    a light beam deflecting means for redirecting said light beam;
    a flexible mounting means for mounting said light beam deflecting means and defining a Z-axis, said mounting means being capable of angular displacement about the X or Y direction; and
    a distortion means proximate said mounting means for introducing a distortion force in said mounting means to cause angular displacement of said mounting means about at least one of said X and Y directions.

2. The device of claim 1, wherein said light beam deflecting means is a mirror.

3. The device of claim 1, wherein said flexible mounting means comprises a spring having different spring constants for angular displacements about said X and Y directions.

4. The device of claim 3, wherein said distortion means is a piezoelectric distortion means.

5. The device of claim 3, wherein said flexible mounting means has folded arms.

6. The device of claim 5, wherein said distortion means is a piezoelectric distortion means.

7. The device of claim 1, wherein said flexible mounting means is a flexible ribbon suspension.

8. The device of claim 7 wherein said ribbon suspension is made from plastic film.

9. The device of claim 1, wherein said distortion means includes: a first magnetic core element attached to said mounting means for angular displacement therewith, said first core element producing a first magnetic field in a first direction; and a first coil means proximate said first core element, said first core element and said first coil means introducing an angular distortion force in said flexible mounting means about at least one of said X and Y directions.

10. The device of claim 9, wherein said flexible mounting means has flexible folded arms permitting angular displacement about said X and Y directions.

11. The device of claim 9, wherein said distortion means further includes: a second magnetic core element attached to said mounting means for angular displacement therewith, said second core element producing a magnetic field generally perpendicular to said first magnetic field and a second coil means proximate said second core element, said second core element and said second coil means an angular distortion force in said flexible mounting means about at least one of said X and Y directions.

12. The device of claim 9, wherein said distortion means further includes a piezoelectric element.

13. A device for providing angular displacement of a light beam about a direction selected from the X and Y directions with respect to a Z axis comprising:
   an entrance aperture at a first end of said device for admitting an incoming light beam;
   a first mirror disposed to receive and reflect said incoming light beam;
   a flexible mounting means mounting said first mirror, said mounting means defining said Z axis, and being capable of angular displacement about the X and Y directions;
   distortion means for inducing angular displacement of said mounting means about the X or Y directions;
   a second mirror disposed generally parallel to said first mirror to receive said reflected beam from said first mirror;
   an exit aperture at a second end of said device opposite said first end, said exit aperture being disposed to permit said beam reflected from said second mirror to exit said device as a scanned beam of light proceeding in the same general direction as said incoming beam.

14. A device according to claim 13 further including: a second flexible mounting means mounting said second mirror, said second mounting means being capable of angular displacements about said X and Y directions independently of said first mounting means;

and a second distortion means for inducing angular displacement of said second mounting means about the X or Y directions to cause generally independent movement of said second mirror with respect to said first mirror.

15. The device of claim 14, wherein said distortion means includes a first magnetic core producing a magnetic field in a plane defined by said X and Y directions and mounted to said flexible mounting means; and a coil means for introducing a force in said first magnetic core to cause angular displacement of said flexible mounting means and first mirror about said X and Y directions.

16. A gyrating optical beam deflector comprising:
   a generally planar flexible member, the plane of said flexible member defining a Z axis perpendicular to said plane and mutually perpendicular X and Y axis in said plane;
   a support coupled to said flexible member at a plurality of spaced apart locations so as to permit flexing of said flexible member intermediate said locations;
   an optical element coupled to said flexible member adjacent said locations; and
   means coupled to said flexible member for applying a force thereto so as to flex said flexible member and rotate said optical element about said X axis.

17. A beam deflector according to claim 16, wherein said force-applying means applies a force to said flexible member so as to flex said flexible member and rotate said optical element about said X axis and said Y axis.

18. A light beam scanner according to claim 17, wherein the other of said mirrors is secured to said support.

19. A light beam scanner according to claim 17, wherein said flexible member includes a perimeter area, a central area, and a plurality of arms connecting said perimeter area with said central area, and said plurality of locations are disposed on said perimeter area so as to permit flexing of said arms and said central area.

20. A light beam scanner according to claim 16, wherein said arms have a generally serpentine shape.

21. A light beam scanner according to claim 16, wherein said arms have a generally spiral shape.

22. A light beam scanner according to claim 21, wherein said flexing means includes an electromagnetic motor.

23. A light beam scanner according to claim 16, wherein said electromagnetic motor includes a coil coupled to said support and a magnet coupled to said flexible member.

* * * * *